United States Patent [19]

Pakonen

[11] Patent Number: 5,392,464
[45] Date of Patent: Feb. 21, 1995

[54] DIRECTIONAL DETECTOR FOR POWER LEVEL CONTROL

[75] Inventor: Hannu Pakonen, Tampere, Finland

[73] Assignee: Nokia Mobile Phones Ltd.

[21] Appl. No.: 109,309

[22] Filed: Aug. 19, 1993

[51] Int. Cl.6 .................. H04B 1/04; H04B 17/00; H03G 3/30
[52] U.S. Cl. .................. 455/115; 455/127; 330/282
[58] Field of Search ............. 330/282, 129, 135, 284, 330/145, 279; 455/126, 127, 115, 67.1; 342/202, 175

[56] References Cited

U.S. PATENT DOCUMENTS

| | | | |
|---|---|---|---|
| 3,697,857 | 10/1972 | El-Banna | 455/127 |
| 4,392,245 | 7/1983 | Mitama | 455/115 |
| 4,602,218 | 7/1986 | Vilmur et al. | 455/126 |
| 4,870,698 | 9/1989 | Katsuyama | 455/127 |
| 4,884,077 | 11/1989 | Landt | 342/202 |
| 5,051,705 | 9/1991 | Moghe et al. | 330/282 |
| 5,109,538 | 4/1992 | Ikonen et al. | 455/126 |

FOREIGN PATENT DOCUMENTS

| | | | |
|---|---|---|---|
| 0218234 | 12/1983 | Japan | 455/116 |
| 0158204 | 7/1986 | Japan | 330/282 |
| 0060321 | 3/1987 | Japan | 455/127 |
| 3283716 | 12/1991 | Japan | 455/127 |

Primary Examiner—Edward F. Urban
Assistant Examiner—Mark D. Wisler
Attorney, Agent, or Firm—Perman & Green

[57] ABSTRACT

Disclosed is power level adjusting apparatus for a data transmission system of the type having a power amplifier means for providing a modulated output signal. A detecting circuit for providing a voltage proportional to the power amplifier means output signal level includes a coupling circuit connected to the output of the power amplifier means for coupling the modulated voltage signal therefrom to provide a detected voltage proportional to the power level of the power amplifier means modulated output voltage signal. A source of bias signal is included for selectively providing a bias signal embodied in one of two bias level states, and a switchable active device circuit is connected to the output of the power amplifier means, to the coupling means and to the source of bias signal, the switchable active device which may be a PIN diode or a GaAs FET is being responsive to the bias signal in a first one of the two bias level states for switching to a non-conducting condition and thereby providing a low signal coupling mode for the coupling means, and the switchable active device circuit is responsive to the bias signal in a second one of the two bias level states for switching to a conducting condition and thereby providing a high signal coupling mode for the coupling means.

3 Claims, 2 Drawing Sheets

DIRECTIONAL DETECTOR FOR POWER LEVEL CONTROL

BACKGROUND OF THE INVENTION

1. Field of the Invention

The present invention relates to circuits for adjusting the power level of a radio frequency transmitter and more particularly to a detector circuit for power measurement in a power level adjustment system for a radio frequency transmitter.

2. Description of the Background Art

In radio frequency transmission systems, it is usual to adjust the transmitter power level. The power level control means typically includes a detector for providing a voltage proportional to the output voltage of the transmitter power amplifier.

In U.S. Pat. No. 4,602,218 issued Jul. 22, 1986 to Vilmur et al., entitled "Automatic Output Control Circuitry For RF Power Amplifiers With Wide Dynamic Range", automatic power output control circuitry is disclosed in which the magnitude of a radio frequency signal is maintained at one of a plurality of magnitudes selected in response to control signals. The radio frequency signal output from a variable output amplifier is sampled and the sample is further amplified and the dynamic range compressed prior to being rectified. The rectified power magnitude signal, which is nonlinearly related to the radio frequency signal magnitude, is adjusted by an adjustment factor selected by the control signals and employed in varying the output of the variable output amplifier to produce a corresponding radio frequency signal output magnitude.

U.S. Pat. No. 5,109,538 issued Apr. 28, 1992 to Ikonen et al. entitled "Circuitry For Widening The Effective Range Of A Transmitter" describes circuitry for widening the power control range of radio telephone. A radio frequency signal is amplified in a controllable power amplifier. After the amplifier a controllable switch is connected, which, while in a first state, does not substantially attenuate the RF power emitted transmitted from the power amplifier. The first power control range of the transmitter is thus produced. When the switch is in a second state, it directs part of the RF power transmitted from the power amplifier to a resistive element and permits part of the RF power to be transmitted to the output of the transmitter. A second power control range is produced in this manner.

U.S. Pat. No. 3,697,857 issued Oct. 10, 1972 to El-Banna entitled "Power Supply And Control Circuit" discloses a power supply and control circuit for providing a high voltage DC output from a low voltage DC source, i.e., a DC battery, especially useful for solid state transmitters. The source is connected across the input and a second source is connected between one terminal of the first source and a corresponding terminal of the input, the second source being in series aiding relationship to the first source. A transistor is serially connected between the first source and the second source, and a diode is connected across the first source with one electrode between the transistor and the second source and the other electrode at the second terminal of the first source. The diode provides short circuit protection.

In U.S. Pat. No. 4,870,698 issued Sep. 26, 1989 to Katsoyama et al. entitled "Output Power Control Circuit For A Mobile Radio Apparatus" an output power control circuit is described disposed in a casing of a mobile radio apparatus together with an automatic power control circuit and an RF signal amplifier. The output power control circuit applied level control signals to the automatic power control circuit for maintaining the power level of the output RF signal of the RF amplifier at one of a plurality of output power levels corresponding to the level control signals. The output power control circuit has a receiver, a temperature sensing circuit and a logic circuit. The receiver receives RF signals transmitted by a master station and dictates power level setting command signals included in the received RF signal. The temperature sensing circuit detects an internal temperature of the casing and provides a power reduction signal upon detecting that the internal temperature has exceeded a predetermined temperature. The logic circuit receives the power level setting command signal from said receiver, and generates a level control signal for determining an output power level corresponding to the power level setting command signal, and generates a level control signal for determining an output power level which is lower than that specified by the power level setting command signal upon receiving the power reduction signal from the temperature sensing circuit.

SUMMARY OF THE INVENTION

In radio frequency transmitters for digital communication systems there is a need to adjust the transmitter power level over a wide range. As part of the power level control or adjustment loop, a directional detector including a directional coupler and a detection circuit is included for power measurement. The usable dynamic operating range of a typical directional detector including a square law rectifier is limited to a 30 to 40 decibel range. High power coupling at low power amplifier output levels serves to increase power measurement accuracy. However high coupling at high power amplifier output levels is not practical because the high coupling causes high losses in the directional coupler.

An object of the present invention therefore, is to provide a directional detector circuit for a power control or adjustment system where the coupling can be adjusted in accordance with the output power levels.

Another object of the present invention is to provide a directional detector for high and low power levels wherein the coupling is adjusted by means of an active device.

A further object of the present invention is to provide a directional detector with switchable coupling by means of a GaAs FET device or a PIN diode as a switching element.

DESCRIPTION OF THE PREFERRED EMBODIMENTS

Radio frequency transmitters for digital communication systems, such as illustrated in the aforesaid U.S.

Pat. Nos. 4,602,218 and 5,109,538 include power amplifiers responsive to the modulated signal to provide gain for the modulated signal which is then connected to the output terminal and antenna for transmission. Adjustment of the transmitter power level is typically carried out by a power measurement structure at the output of the transmitter to obtain the actual power level which is then compared to a reference level. A difference signal is produced by the comparison which is applied to the power amplifier to adjust the gain, and therefore the output power level.

As previously discussed, in digital communication systems there is a need to adjust the transmitter power level over a wide range. The power measurement structure is conventionally a combination of a directional coupler and a detector, referred to as a directional detector. The present invention provides improved directional detector circuits with switchable coupling by an active device for providing low coupling at high power levels and high coupling at low power levels.

Figure 1:
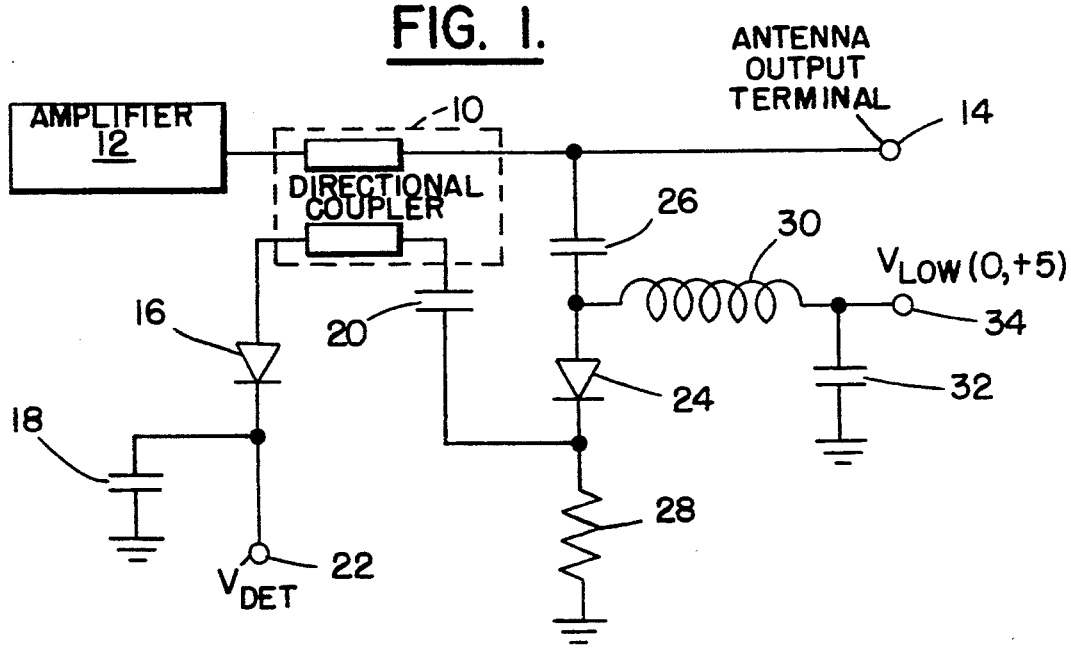
FIG. 1 is a schematic illustration of the circuit diagram of a directional detector using a PIN diode as a switching element.

FIG. 1 is a schematic illustration of a circuit diagram for a directional detector including a switchable active device which is PIN diode. A directional coupler 10, such as a microstrip directional coupler for higher frequency operation, is located in the transmitter output, after the power amplifier stage 12 and before the antenna output terminal 14. The directional coupler 10 is connected to a diode 16 which is a rectifier diode that functions as a power detector, a grounding capacitor 18 and a series capacitor 20. A voltage Vdet proportional to the power level of the modulated signal from the power amplifier stage 12 is obtained on output terminal 22.

A PIN diode 24 is connected to the modulated signal from the power amplifier stage 12 via capacitor 26. The directional coupler 10 is also connected to the other side of PIN diode 24 and through biasing resistor 28 to ground.

The PIN diode 24 is also connected via an RF choke coil 30 and grounded capacitor 32 to a bias voltage source Vlow provided at terminal 34 from the logic section of the communication systems. The bias voltage Vlow is at either one of two states, at zero or at ±5 volts.

When the communication system is operating at a higher power level the bias signal Vlow is zero volts and when the communication system is operating at a lower power level, the bias signal Vlow is 5.0 volts.

PIN diode 24 is a device whose resistance can be controlled with the current flowing through it. With the high current, PIN diode 24 conducts and has a typical resistance of about 10 ohms with no current, PIN diode 24 has a resistance of several thousand ohms. Thus, when the bias voltage Vlow on the PIN diode 24 is zero volts the PIN diode 24 is unbiased and does not conduct and exhibits very high resistance. The coupler circuit then operates as a conventional directional detector including diode 16, capacitors 18 and 20 and resistor 28 and exhibits low coupling, for example 20–30 dB. At lower power levels the bias voltage Vlow at PIN diode 24 is 5.0 volts, PIN diode 24 operates as an active switch and conducts and its resistance decreases, and thus the directional detector coupling increases.

The output of the directional detector is obtained at terminal 22. At low power levels and high coupling the detector output signal at terminal 22 is higher than when there is high power levels and low coupling. Because the coupling is switched from high to low at high power levels, there are lower losses. The directional detector with an active switch thus permits efficient operation at both low and high power levels, thus increasing the power leveling range of the detector.

Figure 2:
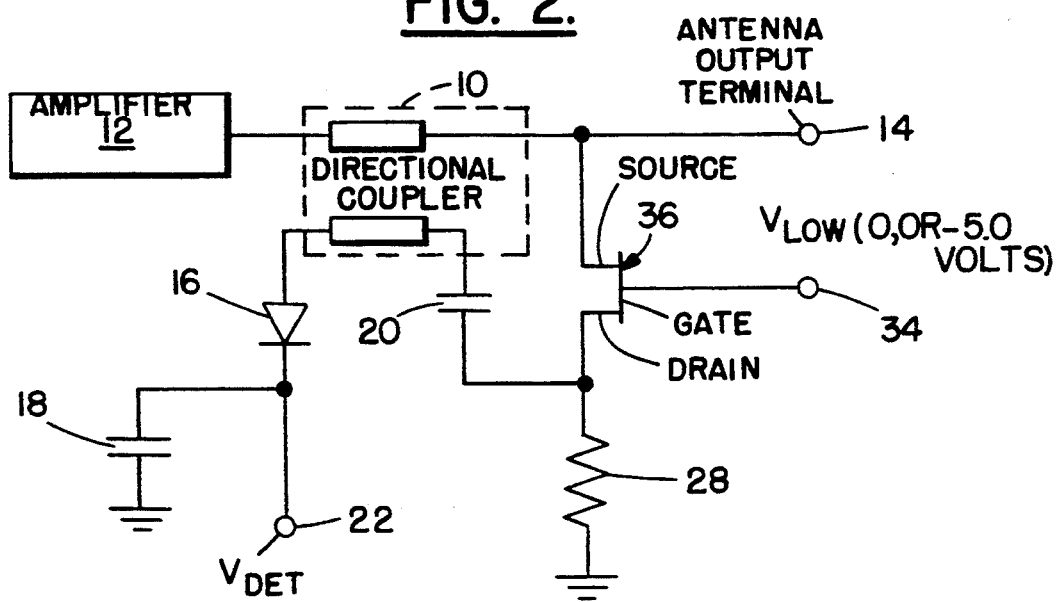
FIG. 2 is a schematic illustration of the circuit diagram of a directional detector using a GaAs FET device as a switching element.

Another embodiment of the present invention wherein the active device for switchable coupling is a GaAs FET is illustrated in FIG. 2. In FIG. 2 the conventional portion of the coupler circuit also includes directional coupler 10 connected to the output of the power amplifier stage 12, diode 16, capacitors 18 and 20, resistor 28 and Vout output terminal 22. The switching circuit includes the Vlow input terminal 34 and the GaAs FET switching device 36.

In the embodiment of FIG. 2, the bias for the active device, i.e., the GaAs FET, is zero volts for low power levels and high coupling and negative (−5.0 volts) for high power levels and low coupling.

At low power levels the bias Vlow at terminal 34 is zero volts and GaAs FET device 36 is conducting. With FET device 36 conducting the insertion loss over the drain-source junction of device 36 is low and therefore coupling is high and suitable for the measuring of the low power levels.

When the bias Vlow is decreased, i.e., Vlow is −5.0 volts, it provides a negative gate-source bias to FET device 36. Device 36 is isolated and does not conduct, therefore the coupler circuit operates as a conventional directional detector with low coupling suitable for measuring high power levels.

In both embodiments of FIG. 1 and FIG. 2 the overall power amplifier stability is improved at low power levels in addition to the benefits of increased power leveling range due to increased coupling at low power levels and lower losses at high power levels due to low coupling.

Figure 3:
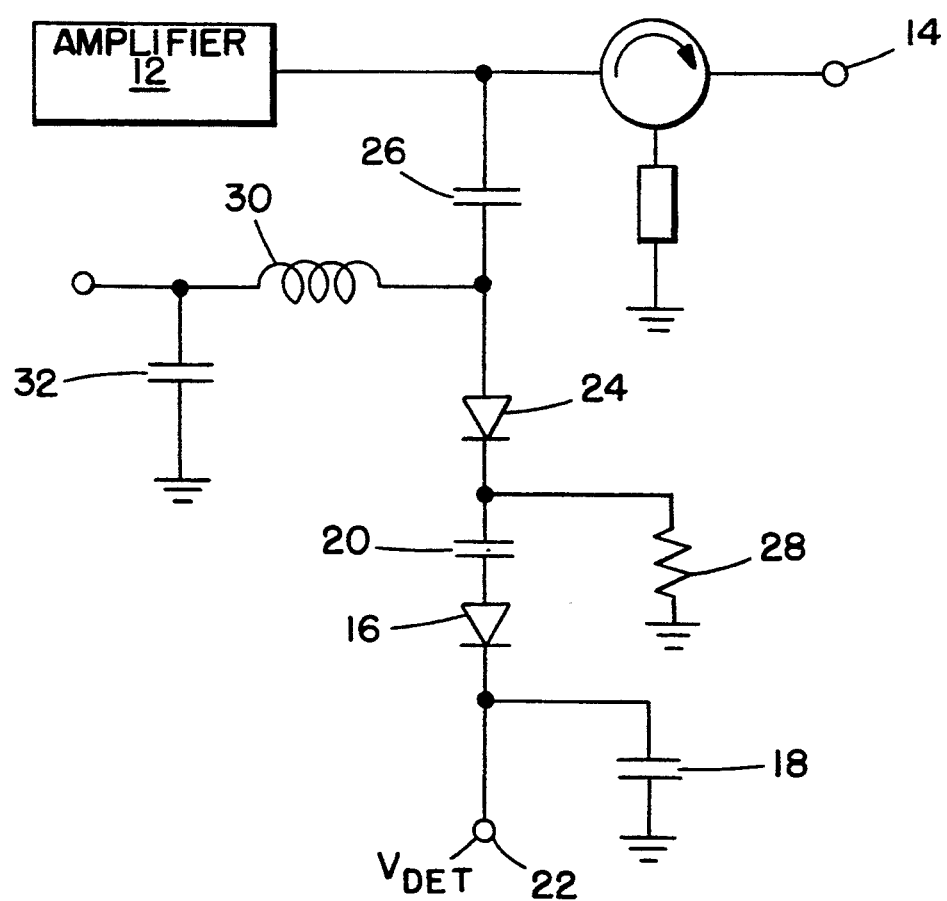
FIG. 3 is a schematic illustration of the circuit diagram of a bidirectional detector incorporating an isolation device.

Still another embodiment of the present invention is illustrated in FIG. 3. In FIG. 3, the amplifier stage 12, the capacitor 26, RF choke coil 30, capacitor 32, PIN diode 24, resistor 28, rectifier diode 16 and capacitor 18 shown in FIG. 1 are also included. The circuit of FIG. 3 operates similar to the circuit of FIG. 1 except that an isolator 40 is included to provide directivity. Isolator 40 is a device wherein a circulator is terminated in a matched load. An ideal circulator is defined as a lossless network in which the energy incident on its port 1 is routed to its port 2 and none is routed to its port 3. In FIG. 3, the circulator port 1 is connected to amplifier stage 12, port 2 is connected to antenna output terminal 14, and port 3 is connected to load resistor 42. Thus, the energy to be transmitted from amplifier stage 12 is fed to antenna output terminal 14 and none is routed to load resistor 42 and the energy from the antenna (a standing wave in the transmission line) is routed to load resistor 42 and none is fed back to the detector circuit.

What has been described is a directional detector for power level control, the detector having switchable coupling with an active device such as a PIN diode or a GaAs FET as a switching device.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

What is claimed is:

1. In a data transmission system having a power amplifier means for providing a modulated output signal having a power level to an antenna output terminal, a detecting means connected between said power amplifier means and said antenna output terminal, for providing a voltage proportional to said power amplifier means modulated output signal level;

a coupling means including a directional device connected to the output of said power amplifier means, a rectifier diode connected to said directional device, a grounding capacitor connected to said rectifier diode, and an output terminal connected to said grounding capacitor and said rectifier diode for providing said detected voltage proportional to the power level of said power amplifier means modulated output signal;

a source of bias signal for selectively providing a bias signal embodied in one of two bias level states;

and a switchable active device circuit connected to said antenna output terminal, to said coupling means and to said source of bias signal; wherein said switchable active device circuit includes a PIN diode, a first capacitor connecting one side of said PIN diode to said antenna output terminal, a second capacitor connecting the other side of said PIN diode means to said directional device, a resistor connecting said second capacitor and said other side of said PIN diode to ground potential, and means for connecting said first capacitor and said one said side of said PIN diode to said source of bias signal.

2. In a data transmission system according to claim 1 wherein said switchable active device circuit includes a capacitor means connected on one side to said directional coupler device, an FET device having first, second and gate electrodes, said first electrode connected to the said antenna output terminal, said second electrode connected to the other side of said capacitor means, and said gate electrode connected to said source of bias signal, and a resistor connected between said capacitor, said second FET electrode and ground potential.

3. In a data transmission system according to claim 1 wherein said directional device is an isolator means having first, second and third ports, wherein said first port of said isolator means is connected to the output of said power amplifier means, said second port is connected to said antenna output terminal and said third port is connected to a load resistor wherein signals from said power amplifier means are connected from said first port to said second port and to said antenna, and signals from said antenna are connected from said second port to said third port and to said load resistor.

* * * * *